(12) United States Patent
Ding et al.

(10) Patent No.: US 12,107,034 B2
(45) Date of Patent: Oct. 1, 2024

(54) SEMICONDUCTOR CHIP AND SEMICONDUCTOR PACKAGE INCLUDING SAME

(71) Applicant: SAMSUNG ELECTRONICS CO., LTD., Suwon-si (KR)

(72) Inventors: Shaofeng Ding, Suwon-si (KR); Sungwook Moon, Yongin-si (KR); Jeonghoon Ahn, Seongnam-si (KR); Yunki Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 374 days.

(21) Appl. No.: 17/517,291

(22) Filed: Nov. 2, 2021

(65) Prior Publication Data
US 2022/0336326 A1 Oct. 20, 2022

(30) Foreign Application Priority Data
Apr. 16, 2021 (KR) .......................... 10-2021-0049971

(51) Int. Cl.
H01L 21/00 (2006.01)
H01L 23/48 (2006.01)
H01L 23/522 (2006.01)
H01L 25/065 (2023.01)

(52) U.S. Cl.
CPC ........ H01L 23/481 (2013.01); H01L 23/5226 (2013.01); H01L 25/0657 (2013.01); H01L 2225/06541 (2013.01)

(58) Field of Classification Search
CPC ..................... H01L 23/481; H01L 23/5226; H01L 25/0657
See application file for complete search history.

(56) References Cited

U.S. PATENT DOCUMENTS

| | | | |
|---|---|---|---|
| 7,859,115 B2 | 12/2010 | Kim et al. | |
| 8,487,444 B2* | 7/2013 | Law | H01L 23/481 257/777 |
| 8,552,563 B2 | 10/2013 | Law et al. | |
| 8,753,939 B2* | 6/2014 | Law | H01L 24/83 257/776 |
| 8,975,729 B2 | 3/2015 | Ramachandran et al. | |
| 9,099,540 B2* | 8/2015 | Law | H01L 24/11 |
| 9,111,936 B2* | 8/2015 | Law | H01L 23/481 |
| 9,142,490 B2 | 9/2015 | Park et al. | |
| 9,390,997 B2 | 7/2016 | Kim et al. | |
| 9,543,200 B2 | 1/2017 | Park et al. | |
| 9,559,003 B2* | 1/2017 | Law | H01L 24/13 |
| 11,749,586 B2* | 9/2023 | Hwang | H01L 27/0886 257/621 |
| 2009/0267183 A1 | 10/2009 | Temple et al. | |

(Continued)

FOREIGN PATENT DOCUMENTS

CN 116314024 A * 6/2023 ....... H01L 21/02266

Primary Examiner — Laura M Menz
(74) Attorney, Agent, or Firm — Sughrue Mion, PLLC

(57) ABSTRACT

A semiconductor chip may include; a device layer including transistors on a substrate, a wiring layer on the device layer, a first through via passing through the device layer and the substrate, and a second through via passing through the wiring layer, the device layer and the substrate, wherein a first height of the first through via is less than a second height of the second through via.

20 Claims, 14 Drawing Sheets

(56) References Cited

U.S. PATENT DOCUMENTS

| | | | |
|---|---|---|---|
| 2010/0032843 A1* | 2/2010 | Chen | H01L 24/05 |
| | | | 257/E23.068 |
| 2010/0225002 A1* | 9/2010 | Law | H01L 23/481 |
| | | | 257/E21.597 |
| 2010/0252934 A1* | 10/2010 | Law | H01L 21/76898 |
| | | | 257/E21.597 |
| 2013/0230985 A1* | 9/2013 | Law | H01L 21/76898 |
| | | | 438/667 |
| 2013/0316530 A1* | 11/2013 | Law | H01L 21/76898 |
| | | | 438/637 |
| 2014/0054742 A1 | 2/2014 | Katti | |
| 2014/0264941 A1* | 9/2014 | Law | H01L 23/49827 |
| | | | 257/774 |
| 2015/0357240 A1* | 12/2015 | Law | H01L 21/768 |
| | | | 438/109 |
| 2017/0194248 A1* | 7/2017 | Das | H01L 21/187 |
| 2019/0326180 A1* | 10/2019 | Lee | H01L 29/41791 |
| 2021/0057309 A1* | 2/2021 | Hu | H01L 23/481 |
| 2022/0084885 A1* | 3/2022 | Han | H01L 21/76898 |
| 2022/0278024 A1* | 9/2022 | Ding | H01L 23/481 |
| 2022/0310485 A1* | 9/2022 | Hwang | H01L 23/528 |
| 2022/0320299 A1* | 10/2022 | Chen | H01L 21/823475 |
| 2022/0336326 A1* | 10/2022 | Ding | H01L 23/481 |
| 2023/0116911 A1* | 4/2023 | Lee | H01L 23/53228 |
| | | | 257/621 |
| 2023/0238283 A1* | 7/2023 | Lee | H01L 29/42364 |
| | | | 257/332 |
| 2023/0361004 A1* | 11/2023 | Hwang | H01L 25/0657 |
| 2024/0038841 A1* | 2/2024 | Park | H01L 23/535 |
| 2024/0071924 A1* | 2/2024 | Park | H01L 21/76816 |

* cited by examiner

SEMICONDUCTOR CHIP AND SEMICONDUCTOR PACKAGE INCLUDING SAME

CROSS-REFERENCE TO RELATED APPLICATION

This U.S. nonprovisional application claims priority under 35 U.S.C. § 119 to Korean Patent Application No. 10-2021-0049971 filed on Apr. 16, 2021 in the Korean Intellectual Property Office, the subject matter of which is hereby incorporated by reference in its entirety.

BACKGROUND

The inventive concept relates generally to semiconductor chips and semiconductor packages including same. More particularly, the inventive concept relates to semiconductor chips including a through via and semiconductor packages including same.

As the electronics industry develops and in order to meet users demands, contemporary and emerging semiconductor packages must be smaller in size, provide improved overall performance and operate with reduced power consumption. In order to satisfy these disparate requirements, semiconductor packages may include multiple semiconductor chips stacked on top of one another. Various methods of connecting stacked semiconductor chips using a through via penetrating a semiconductor chip have been proposed. Such a through via may be referred to as a through-silicon via (or TSV). Inclusion of a through via affords opportunities to improve operating speed and reduce power consumption, compared with certain wire bonding technologies that have been used to electrically connect stacked semiconductor chips.

SUMMARY

Embodiments of the inventive concept provide semiconductor chips exhibiting reduced power loss due to electrical resistance as well as improved signal/power integrity. Other embodiments of the inventive concept provide semiconductor packages including same.

In one aspect of the inventive concept, a semiconductor chip may include; a device layer including transistors on a substrate, a wiring layer on the device layer, a first through via passing through the device layer and the substrate, and a second through via passing through the wiring layer, the device layer and the substrate, wherein a first height of the first through via is less than a second height of the second through via.

In another aspect of the inventive concept, a semiconductor chip may include; a substrate including a first surface and an opposing second surface, a device layer including transistors on the first surface of the substrate, a first wiring layer on the device layer, a second wiring layer on the first wiring layer, a first through via extending from the first wiring layer to the second surface of the substrate, a second through via extending from the second wiring layer to the second surface of the substrate, a first through via insulating layer on a side surface of the first through via, and a second through via insulating layer on a side surface of the second through via.

In another aspect of the inventive concept, a semiconductor package may include; a first semiconductor chip, and a second semiconductor chip on the first semiconductor chip. The first semiconductor chip may include; a substrate, a device layer including transistors on a substrate, a wiring structure including wiring layers stacked on the device layer, a first through via passing through the device layer and the substrate, a second through via passing through at least one of the wiring layers, the device layer and the substrate, a first through via insulating layer on a side surface of the first through via, and a second through via insulating layer on a side surface of the second through via, wherein a first height of the first through via is less than a second height of the second through via, the first through via communicates a non-power signal, and the second through via communicates a power signal.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms and descriptions are relative in nature, arbitrary in descriptive relationship(s) and/or directed to aspect(s) of illustrated embodiment(s). Geometric terms may include, for example: height/width; vertical/horizontal; top/bottom; higher/lower; closer/farther; thicker/thinner; proximate/distant; above/below; under/over; upper/lower; center/side; surrounding; through; center/side; overlay/underlay; etc.

Figure 1:
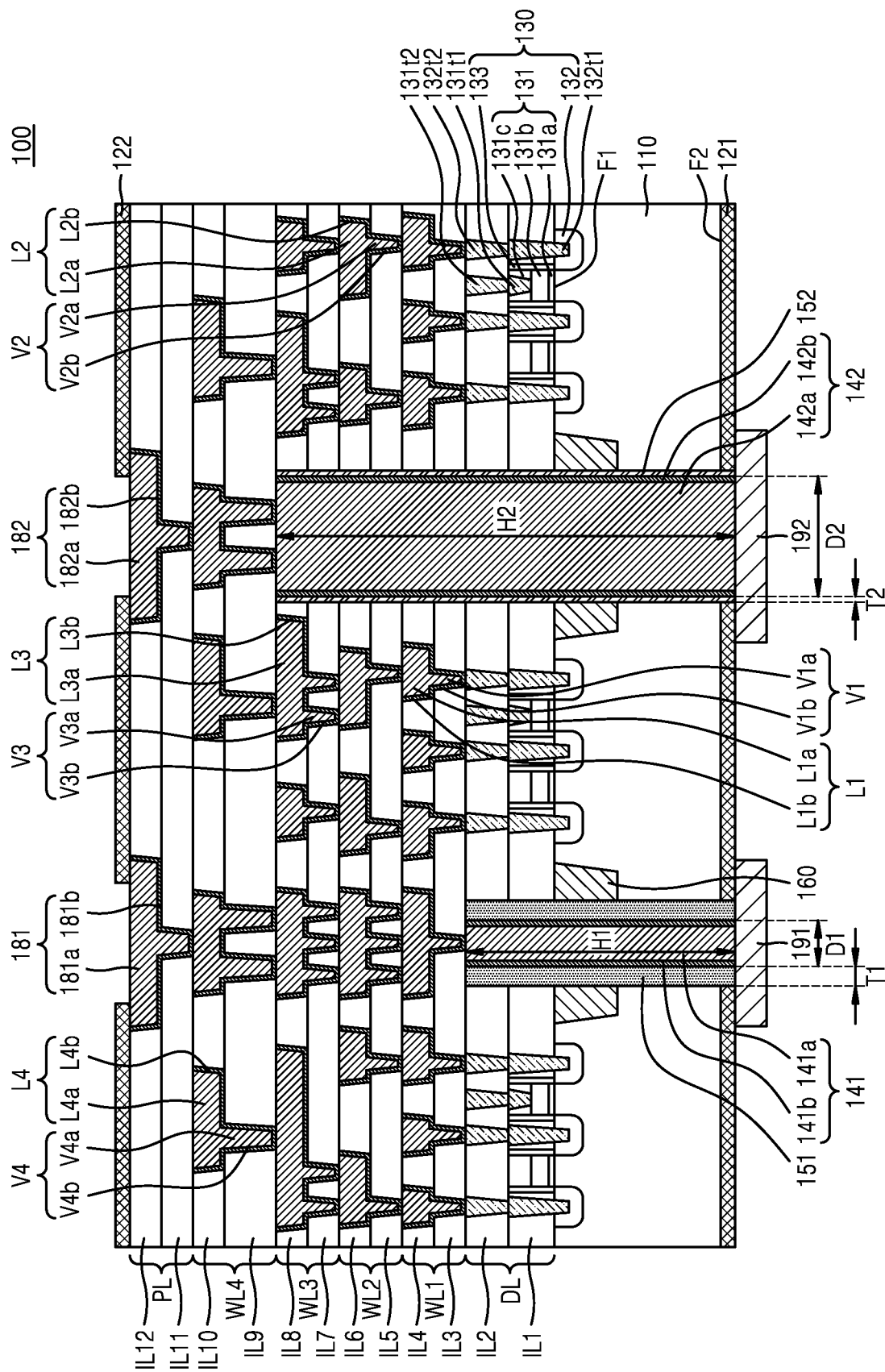
FIGS. 1, 2, 3, 4, 5, and 6 are respective cross-sectional diagrams variously illustrating semiconductor chips according to embodiments of the inventive concept.

Figure (FIG. 1 is a cross-sectional diagram illustrating a semiconductor chip 100 according to embodiments of the inventive concept.

Referring to FIG. 1, the semiconductor chip 100 may include a substrate 110, a device layer DL on a first surface F1 of the substrate 110, at least one wiring layer on the device layer DL, for example, first to third wiring layers WL1 to WL3, a first through via 141, and a second through via 142. In some embodiments, the semiconductor chip 100 may further include a deep trench isolation layer 160 in the substrate 110. In some embodiments, the semiconductor chip 100 may further include a fourth wiring layer WL4 on the second through via 142. In some embodiments, the semiconductor chip 100 may further include a first through via insulating layer 151 on a side surface of the first through via 141 and a second through via insulating layer 152 on a side surface of the second through via 142. In some embodiments, the semiconductor chip 100 may further include a pad layer PL on the fourth wiring layer WL4. In some embodiments, the semiconductor chip 100 may further include an upper insulating layer 122 on the pad layer PL and a lower insulating layer 121 on a second surface f2 of the substrate 110. In some embodiments, the semiconductor chip 100 may further include a first lower pad 191 on a lower surface of the first through via 141 and a second lower pad 192 on a lower surface of the second through via 142.

Here, the first surface F1 and the opposing second surface F2 may define upper and lower, principal surfaces of the substrate 110. The substrate 110 may include a semiconductor material such as a group IV semiconductor material, a group III-V semiconductor material, or a group II-VI semiconductor material. The group IV semiconductor material may include, for example, silicon (Si), germanium (Ge), or silicon (Si)-germanium (Ge). The group III-V semiconductor material may include, for example, gallium arsenide (GaAs), indium phosphate (InP), gallium phosphate (GaP), indium arsenide (InAs), indium antimony (InSb), or indium gallium arsenide (InGaAs). The group II-VI semiconductor material may include, for example, zinc telluride (ZnTe) or cadmium sulfide (CdS). The substrate 110 may be a bulk wafer or an epitaxial layer.

The deep trench isolation layer 160 may extend into the substrate 110 from the first surface F1 of the substrate 110. The deep trench isolation layer 160 may include silicon oxide, silicon nitride, or a combination thereof.

The device layer DL is disposed on the first surface F1 of the substrate 110. The device layer DL may include various semiconductor devices. The semiconductor device may include, for example, at least one of a logic device, a memory device, and a sensor device. For example, the logic device may include an application processor (AP), a graphics processing unit (GPU), a central processing unit (CPU), or a memory controller. For example, the memory device may include flash memory, dynamic random access memory (DRAM), static random access memory (SRAM), electrically erasable programmable read-only memory (EEPROM), phase-change random access memory (PRAM), magnetoresistive random access memory (MRAM), or resistive random access memory (RRAM). The sensor device may include, for example, a CMOS image sensor (CIS).

In some embodiments, the device layer DL may include transistors 130 on the first surface F1 of the substrate 110. A first interlayer insulating layer IL1 may substantially surround the transistors 130, first source/drain contacts 132t1, and/or first gate contacts 131t1 variously contacting the transistors 130. A second interlayer insulating layer IL2 may be disposed on the first interlayer insulating layer IL1 substantially surrounding second source/drain contacts 132t2 passing through the second interlayer insulating layer IL2 and second gate contacts 131t2.

Each transistor 130 may include a gate structure 131, gate spacers 133 on respective sides of the gate structure 131, and two sources/drains 132 on respective sides of the gate structure 131. The gate structure 131 may include a gate insulating layer 131a on the first surface F1 of the substrate 110, a gate electrode 131b on the gate insulating layer 131a, and a gate capping layer 131c on the gate electrode 131b.

In some embodiments, the gate insulating layer 131a may include silicon oxide, a high-k material, or a combination thereof. Here, the high-k material may be a material having a dielectric constant greater than that of silicon oxide. The gate electrode 131b may include, for example, polysilicon, a metal, or a combination thereof. The gate capping layer 131c may include, for example, silicon nitride. The gate spacers 133 may include, for example, an insulating material such as silicon oxide, silicon nitride, or a combination thereof. The source/drain 132 may be a region doped with an impurity in the substrate 110 or a semiconductor layer epitaxially grown and doped with an impurity. For example, the source/drain 132 may include a semiconductor material such as silicon (Si), germanium (Ge), or a combination thereof and N-type or P-type impurities.

Although the transistor 130 is specifically illustrated in FIG. 1 as a planar transistor, in other embodiments, the transistor 130 may be a three-dimensional (3D) transistor, such as a Fin-type Field Effect Transistor (FET) (FINFET), a gate all-around FET (GAAFET), or a multi-bridge channel FET (MBCFET). The device layer DL may include various discrete devices of differing type(s) in addition to the transistors 130. The discrete devices may include, for example, active elements and/or passive elements, such as diodes, photodiodes, capacitors, resistors, and the like.

In FIG. 1, although the device layer DL is shown as including only two (2) interlayer insulating layers (e.g., the first interlayer insulating layer IL1 and the second interlayer insulating layer IL2), number and type of interlayer insulating layers included in the device layer DL may vary be design. However, in some embodiments, each of the first interlayer insulating layer IL1 and the second interlayer insulating layer IL2 may include an insulating material such as silicon oxide, silicon nitride, and/or a low-k material.

Here, the low-k material may be a material having a dielectric constant less than that of silicon oxide, and may include for example, flowable oxide (FOX), torene silaZene (TOSZ), undoped silica glass (USG), borosilica glass (BSG), phosphosilica glass (PSG), BoroPhosphoSilica Glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof.

Each of the first source/drain contacts 132t1 may penetrate the first interlayer insulating layer IL1 to contact the source/drain 132. Each of the first gate contacts 131t1 may penetrate the first gate capping layer 131c to contact the gate electrode 131b of the gate structure 131. Each of the second source/drain contacts 132t2 may penetrate the second interlayer insulating layer IL2 to contact the first source/drain contacts 132t1. Each of the second gate contacts 131t2 may penetrate the second interlayer insulating layer IL2 to contact the first gate contact 131t1. The first source/drain contact 132t1, the first gate contact 131t1, the second source/drain contact 132t, and the second gate contact 131t2 may include a metal, for example, tungsten (W), cobalt (Co), copper (Cu), ruthenium (Ru), manganese (Mn), aluminum (Al), silver (Ag), gold (AU), or a combination thereof. In some embodiments, the first source/drain contact 132t1 and the first gate contact 131t1 may include a barrier layer and a metal layer on the barrier layer. The barrier layer may include, for example, titanium (Ti), tantalum (Ta), titanium nitride (TiN), tantalum nitride (TaN), or a combination thereof. In some embodiments, a silicide layer may be further disposed between the first source/drain contact 132t1 and the source/drain 132. The silicide layer may include, for example, titanium silicide, tungsten silicide, ruthenium silicide, niobium silicide, molybdenum silicide, hafnium silicide, nickel silicide, cobalt silicide, platinum silicide, ytterbium silicide, terbium silicide, dysprosium silicide, erbium silicide, palladium silicide, or combinations thereof.

Wiring layers (e.g., first, second, third and fourth wiring layers WL1, WL2, WL3 and WL4—hereafter collectively, "first to fourth wiring layers WL1 to WL4") may be variously disposed on the device layer DL. Here, although four (4) wiring layers are shown in FIG. 1, the number, type and/or constituent make-up of wiring layers included in the semiconductor chip 100 may vary by design.

The first wiring layer WL1 may include a third interlayer insulating layer IL3 on the device layer DL, a fourth interlayer insulating layer IL4 on the third interlayer insulating layer IL3, a first via V1 passing through the third interlayer insulating layer IL3, and a first line L1 passing through the fourth interlayer insulating layer IL4. The third interlayer insulating layer IL3 may substantially surround the first via V1, and the fourth interlayer insulating layer IL4 may substantially surround the first line L1. The third interlayer insulating layer IL3 and the fourth interlayer insulating layer IL4 may include silicon oxide, silicon nitride, a low-k material, or a combination thereof. In some embodiments, the third interlayer insulating layer IL3 and the fourth interlayer insulating layer IL4 may be formed as a single body.

A first via V1 may extend between the second source/drain contact 132*t*2 and the first line L1. Another first via V1 may extend between the second gate contact 131*t*2 and the first line L1, and yet another first via V1 may extend between the first through via 141 and the first line L1. Here, the various first vias V1 may include a first via barrier layer V1*b* and a first via metal layer V1*a* on the first via barrier layer V1*b*.

The first line L1 may include a first line barrier layer L1*b* and a first line metal layer L1*a* on the first line barrier layer L1*b*. In some embodiments, the first via V1 and the first line L1 may be formed as a single body. For example, the first via barrier layer V1*b* and the first line barrier layer L1*b* may be integrally formed, and the first via metal layer V1*a* and the first line metal layer L1*a* may be formed as a single body.

The first via barrier layer V1*b* and the first line barrier layer L1*b* may include, for example, titanium (Ti), tantalum (Ta), titanium nitride (TiN), tantalum nitride (TaN), or a combination thereof. The first via metal layer V1*a* and the first line metal layer L1*a* may include copper (Cu), tungsten (W), aluminum (Al), gold (Au), silver (Ag), titanium (Ti), or a combination thereof.

The second interconnection layer WL2 may include a fifth interlayer insulating layer IL5 on the first interconnection layer WL1, a sixth interlayer insulating layer IL6 on the fifth interlayer insulating layer IL5, a second via V2 passing through the fifth interlayer insulating layer IL5, and a second line L2 passing through the sixth interlayer insulating layer IL6. The fifth interlayer insulating layer IL5 may substantially surround the second via V2, and the sixth interlayer insulating layer IL6 may substantially surround the second line L2. The fifth interlayer insulating layer IL5 and the sixth interlayer insulating layer IL6 may include silicon oxide, silicon nitride, a low-k material, or a combination thereof. In some embodiments, the fifth interlayer insulating layer IL5 and the sixth interlayer insulating layer IL6 may be formed as a single body.

A second via V2 may extend between the first line L1 and the second line L2. Here, the second via V2 may include a second via barrier layer V2*b* and a second via metal layer V2*a* on the second via barrier layer V2*b*. The second line L2 may include a second line barrier layer L2*b* and a second line metal layer L2*a* on the second line barrier layer L2*b*. In some embodiments, the second via V2 and the second line L2 may be formed as a single body. For example, the second via barrier layer V2*b* and the second line barrier layer L2*b* may be formed as a single body, and the second via metal layer V2*a* and the second line metal layer L2*a* may be formed as a single body.

The second via barrier layer V2*b* and the second line barrier layer L2*b* may include, for example, titanium (Ti), tantalum (Ta), titanium nitride (TiN), tantalum nitride (TaN), or a combination thereof. The second via metal layer V2*a* and the second line metal layer L2*a* may include copper (Cu), tungsten (W), aluminum (Al), gold (Au), silver (Ag), titanium (Ti), or a combination thereof.

The third interconnection layer WL3 may include a seventh interlayer insulating layer IL7 on the second interconnection layer WL2, an eighth interlayer insulating layer IL8 on the seventh interlayer insulating layer IL7, a third via V3 passing through the seventh interlayer insulating layer IL7, and a third line L3 passing through the eighth interlayer insulating layer IL8. The seventh interlayer insulating layer IL7 may substantially surround the third via V3, and the eighth interlayer insulating layer IL8 may substantially surround the third line L3. The seventh interlayer insulating layer IL7 and the eighth interlayer insulating layer IL8 may include silicon oxide, silicon nitride, a low-k material, or a combination thereof. In some embodiments, the seventh interlayer insulating layer IL7 and the eighth interlayer insulating layer IL8 may be formed as a single body.

A third via V3 may extend between the second line L2 and the third line L3. Here, the third via V3 may include a third via barrier layer V3*b* and a third via metal layer V3*a* on the third via barrier layer V3*b*. The third line L3 may include a third line barrier layer L3*b* and a third line metal layer L3*a* on the third line barrier layer L3*b*. In some embodiments, the third via V3 and the third line L3 may be formed as a single body. For example, the third via barrier layer V3*b* and the third line barrier layer L3*b* may be formed as a single body, and the third via metal layer V3*a* and the third line metal layer L3*a* may be formed as a single body.

The third via barrier layer V3*b* and the third line barrier layer L3*b* may include, for example, titanium (Ti), tantalum (Ta), titanium nitride (TiN), tantalum nitride (TaN), or a combination thereof. The third via metal layer V3*a* and the third line metal layer L3*a* may include copper (Cu), tungsten (W), aluminum (Al), gold (Au), silver (Ag), titanium (Ti), or a combination thereof.

The fourth interconnection layer WL4 may include a ninth interlayer insulating layer IL9 on the third interconnection layer WL3, a tenth interlayer insulating layer IL10 on the ninth interlayer insulating layer IL9, a fourth via V4 passing through the ninth interlayer insulating layer IL9, and a fourth line L4 passing through the tenth interlayer insulating layer IL10. The ninth interlayer insulating layer IL9 may substantially surround the fourth via V4, and the tenth interlayer insulating layer IL10 may substantially surround the fourth line L4. The ninth interlayer insulating layer IL9 and the tenth interlayer insulating layer IL10 may include silicon oxide, silicon nitride, a low-k material, or a combination thereof. In some embodiments, the ninth insulating layer IL9 and the tenth interlayer insulating layer IL10 may be formed as a single body.

A fourth via V4 may extend between the third line L3 and the fourth line L4, and another fourth via V4 may extend between the second through via 142 and the fourth line L4. Here, each fourth via V4 may include a fourth via barrier layer V4*b* and a fourth via metal layer V4*a* on the fourth via barrier layer V4*b*. The fourth line L4 may include a fourth line barrier layer L4*b* and a fourth line metal layer L4*a* on the fourth line barrier layer L4*b*. In some embodiments, the fourth via V4 and the fourth line L4 may be formed as a single body. For example, the fourth via barrier layer V4*b* and the fourth line barrier layer L4*b* may be formed as a single body, and the fourth via metal layer V4a and the fourth line metal layer L4a may be formed as a single body.

The fourth via barrier layer V4b and the fourth line barrier layer L4b may include, for example, titanium (Ti), tantalum (Ta), titanium nitride (TiN), tantalum nitride (TaN), or a combination thereof. The fourth via metal layer V4a and the fourth line metal layer L4a may include copper (Cu), tungsten (W), aluminum (Al), gold (Au), silver (Ag), titanium (Ti), or a combination thereof.

The first through via 141 may pass through the substrate 110 and the device layer DL, but may not pass through the first to fourth wiring layers WL1 to WL4. That is, the first through via 141 may extend from the first wiring layer WL1 to the second surface F2 of the substrate 110. The second through via 142 may pass through the substrate 110, the device layer DL, and at least one wiring layer, for example, at least one of the first to third wiring layers WL1 to WL3. In some embodiments, the second through via 142 may not penetrate through the fourth wiring layer WL4. That is, the second through via 142 may extend from the fourth wiring layer WL4 to the second surface F2 of the substrate 110. In FIG. 1, although the second through via 142 is illustrated as passing through only three wiring layers, for example, the first to third wiring layers WL1 to WL3, the second through via 142 may pass through more or less than three wiring layers. In some embodiments, the first through via 141 and the second through via 142 may further penetrate the deep trench isolation layer 160.

The first through via 141 may include a first through via metal layer 141a and a first through via barrier layer 141b on a side surface of the first through via metal layer 141a. The second through via 142 may include a second through via metal layer 142a and a second through via barrier layer 142b on a side surface of the second through via metal layer 142a. The first through via metal layer 141a and the second through via metal layer 142a may include copper (Cu), tungsten (W), aluminum (Al), gold (Au), silver (Ag), titanium (Ti), or a combination thereof. The first through via barrier layer 141b and the second through via barrier layer 142b may include titanium (Ti), tantalum (Ta), titanium nitride (TiN), tantalum nitride (TaN), or a combination thereof.

The first through via insulating layer 151 may electrically isolate the first through via 141 from the substrate 110 and the device layer DL. For example, the first through via insulating layer 151 may extend between the first through via 141 and the substrate 110, between the first through via 141 and the deep trench isolation layer 160, and between the first through via 141 and the device layer DL.

The second through via insulating layer 152 may electrically isolate the second through via 142 from the substrate 110, the device layer DL, and the first to third wiring layers WL1 to WL3. For example, the second through via insulating layer 152 may extend between the second through via 142 and the substrate 110, between the second through via 142 and the deep trench isolation layer 160, between the second through via 142 and the device layer DL, and between the second through via 142 and the first to third wiring layers WL1 to WL3.

The pad layer PL may be disposed on the uppermost wiring layer among the plurality of wiring layers, for example, the fourth wiring layer WL4. The pad layer PL may include, for example, an eleventh interlayer insulating layer IL11 on the fourth wiring layer WL4, a twelfth interlayer insulating layer IL12 on the eleventh interlayer insulating layer IL11, and a first upper pad 181 and a second upper pad 182 penetrating the eleventh interlayer insulating layer IL11 and the twelfth interlayer insulating layer IL12. In some embodiments, the eleventh interlayer insulating layer IL11 and the twelfth interlayer insulating layer IL12 may be formed as a single body.

The first upper pad 181 and the second upper pad 182 may be connected to the fourth wiring layer WL4. In another embodiment, the second through via 142 may further penetrate the fourth wiring layer WL4, and the second upper pad 182 may directly contact the second through via 142. The first upper pad 181 may include a first upper pad barrier layer 181b on the eleventh interlayer insulating layer IL11 and the twelfth interlayer insulating layer IL12 and a first upper pad metal layer 181a on the first upper pad barrier layer 181b. The second upper pad 182 may include a second upper pad barrier layer 182b on the eleventh interlayer insulating layer IL11 and the twelfth interlayer insulating layer IL12 and a second upper pad metal layer 182a on the second upper pad barrier layer 182b.

The first upper pad barrier layer 181b and the second upper pad barrier layer 182b may include titanium (Ti), tantalum (Ta), titanium nitride (TiN), tantalum nitride (TaN), or a combination thereof. The first upper pad metal layer 181a and the second upper pad metal layer 182a may include copper (Cu), tungsten (W), aluminum (Al), gold (Au), silver (Ag), titanium (Ti), or a combination thereof. The eleventh interlayer insulating layer IL11 and the twelfth interlayer insulating layer IL12 may include, for example, silicon oxide, silicon nitride, a low-k material, or a combination thereof.

The first lower pad 191 may be at a lower end of the first through via 141. The second lower pad 192 may be at a lower end of the second through via 142. The first lower pad 191 and the second lower pad 192 may include copper (Cu), tungsten (W), aluminum (Al), gold (Au), silver (Ag), titanium (Ti), or a combination thereof.

The upper insulating layer 122 may be disposed on the pad layer PL, and may expose at least a portion of the first upper pad 181 and at least a portion of the second upper pad 182. The lower insulating layer 121 may be disposed on the second surface F2 of the substrate 110. In some embodiments, the lower insulating layer 121 may further extend between the second surface F2 of the substrate 110 and the first lower pad 191 and between the second surface F2 of the substrate 110 and the second lower pad 192. The upper insulating layer 122 and the lower insulating layer 121 may include silicon oxide, silicon nitride, a polymer, or a combination thereof.

The first through via 141 may be configured to "communicate" (e.g., transmit and/or receive) a non-power signal (e.g., a signal other than a power signal—hereafter simply, a "signal"), and the second through via 142 may be configured to communicate a power signal—hereafter simply, "power"). That is, the signal may be communicated through the first lower pad 191, the first through via 141, the first to fourth wiring layers WL1 to WL4, and the first upper pad 181. In addition, power may be communicated through the second lower pad 192, the second through via 142, the fourth wiring layer WL4, and the second upper pad 182. In this regard, the nature of the signal may vary by design, and may be a digital signal, an analog signal, a simple binary signal or an arrangement of multiple digital and/or analog signals.

Because the second through via 142 passes through the first to third wiring layers WL1 to WL3, a second height H2 of the second through via 142 may be greater than a first height H1 of the first through via 141. In this regard, the term "height" may be understood as a dimension measured in an arbitrary "vertical" direction in relation to an arbitrarily selected "horizontal" level or surface (e.g., the second surface F2 of the substrate 110). Because the second through via 142 is directly connected to the fourth wiring layer WL4 without passing through the first to third wiring layers WL1 to WL3 having a relatively high resistance, power loss due to the presence of the combined electrical resistance of the first to third wiring layers WL1 to WL3 may be prevented. In some embodiments, the difference between the first height H1 of the first through via 141 and the second height H2 of the second through via 142 may range from between about 1 μm to about 5 μm. In some embodiments, the first height H1 of the first through via 141 may range from between about 40 μm to about 60 μm.

In some embodiments, a second diameter D2 of the second through via 142 may be greater than a first diameter D1 of the first through via 141. Accordingly, while power loss due to the resistance of the second through via 142 is reduced, to first volume (e.g., area times height) occupied by the first through via 141 may be reduced, thereby improving the degree of integration for the semiconductor chip 100. For example, the first diameter D1 of the first through via 141 may range from between about 2 μm to about 4 μm. For example, the second diameter D2 of the second through via 142 may range from between about 6 μm to about 8 μm.

In some embodiments, a second capacitance formed by the second through via 142, the second through via insulating layer 152, and the substrate 110 may be greater than a first capacitance formed by the first through via 141, the first through via insulating layer 151, and the substrate 110. Accordingly, signal integrity may be improved due to the relatively small first capacitance, and power integrity may be improved due to the relatively large second capacitance.

Here, it should be noted that capacitance is proportional to area and dielectric constant and inversely proportional to the thickness of a dielectric layer. In order to achieve a relatively small first capacitance and a relatively large second capacitance, for example, the second height H2 and/or the second diameter D2 of the second through via 142 may be greater than the first height H1 and/or the first diameter D1 of the first through via 141. Accordingly, a second volume of the second through via 142 may be greater than the first volume of the first through via 141.

Further, to achieve a relatively small first capacitance and a relatively large second capacitance, in some embodiments, a second dielectric constant of a second material of the second through via insulating layer 152 may be greater than a first dielectric constant of a first material of the first through via insulating layer 151. The first through via insulating layer 151 may include silicon oxide, a low-k material having a dielectric constant smaller than that of silicon oxide, or a combination thereof. The second through via insulating layer 152 may include a high-k material having a dielectric constant greater than that of silicon oxide. For example, the high-k material may include aluminum oxide ($Al_2O_3$), hafnium oxide ($HfO_2$), zirconium oxide ($ZrO_2$), tantalum oxide ($Ta_2O_5$), titanium oxide ($TiO_2$), or a combination thereof.

Further, to achieve a relatively small first capacitance and a relatively large second capacitance, in some embodiments, a second thickness T2 of the second through via insulating layer 152 may be less than a first thickness T1 of the first through via insulating layer 151. For example, the first thickness T1 of the first through via insulating layer 151 may range from between about 100 nm to about 400 nm, and the second thickness T2 of the second through via insulating layer 152 may range from between about 50 nm to about 200 nm.

Figure 2:
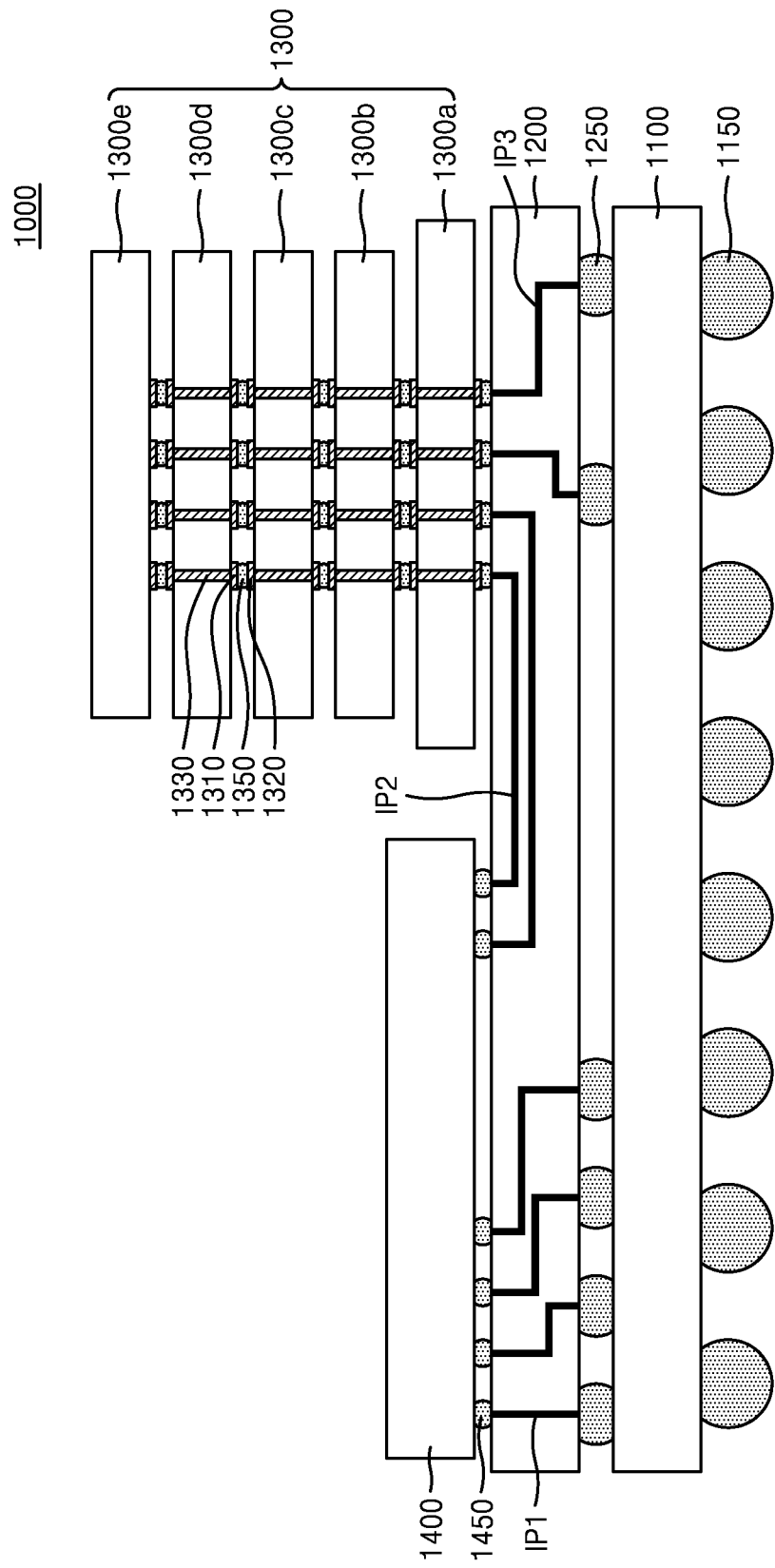

FIG. 2 is a cross-sectional diagram illustrating a semiconductor package 1000 according to embodiments of the inventive concept.

Referring to FIG. 2, the semiconductor package 1000 may include a package substrate 1100, an interposer substrate 1200 on the package substrate 1100, a first logic chip 1400 on the interposer substrate 1200, and a semiconductor chip stack 1300 on the interposer substrate 1200. The semiconductor chip stack 1300 may include a second logic chip 1300a and four memory chips 1300b to 1300e vertically stacked on the interposer substrate 1200. Although the semiconductor chip stack 1300 is illustrated as including four (4) memory chips 1300b, 1300c, 1300d and 1300e in FIG. 2, the number of memory chips arranged in the semiconductor chip stack 1300 may vary by design (e.g., 8, 12, or 16 memory chips). In some embodiments, the semiconductor package 1000 may be a high bandwidth memory (HBM).

The package substrate 1100 may be connected to the outside of the semiconductor package 1000 through package bumps 1150.

The interposer substrate 1200 may be connected to the package substrate 1100 through interposer bumps 1250. The interposer bump 1250 may have a smaller size than the package bumps 1150. The interposer substrate 1200 may include a first internal path IP1 connecting the first logic chip 1400 to the package substrate 1100, a second internal path IP2 connecting the first logic chip 1400 to the semiconductor chip stack 1300, and a third internal path IP3 connecting the semiconductor chip stack 1300 to the package substrate 1100.

The first logic chip 1400 may be connected to the interposer substrate 1200 through a first chip bumps 1450. The first logic chip 1400 may be, for example, a GPU chip, a CPU chip, or a system on chip (SoC). The first chip bumps 1450 may have a smaller size than the interposer bumps 1250.

The second logic chip 1300a may be connected to the interposer substrate 1200 through a second chip bumps 1350. The second chip bumps 1350 may have a smaller size than the interposer bumps 1250. The second logic chip 1300a may control the four memory chips 1300b to 1300e. In some embodiments, each of the memory chips 1300b to 1300e may be a DRAM chip. The second logic chip 1300a and the four memory chips 1300b to 1300e may be connected to each other through second chip bumps 1350. For example, the second chip bumps 1350 may be disposed between an upper chip pad 1320 of the second memory chips 1300c and a lower chip pad 1310 of the third memory chip 1300d.

At least one of the second logic chip 1300a and the four memory chips 1300b, 1300c, 1300d, and 1300e may include the semiconductor chip 100 of FIG. 1. For example, the upper chip pad 1320, a through via 1330, and the lower chip pad 1310 of at least one semiconductor chip may respectively correspond to the first lower pad 191, the first through via 141, and the first upper pad 181 of FIG. 1. In addition, another upper chip pad 1320, another through via 1330, and another lower chip pad 1310 of the at least one semiconductor chip may respectively correspond to the second lower pad 192, the second through via 142, and the second upper pad 182 of FIG. 1.

Figure 3:
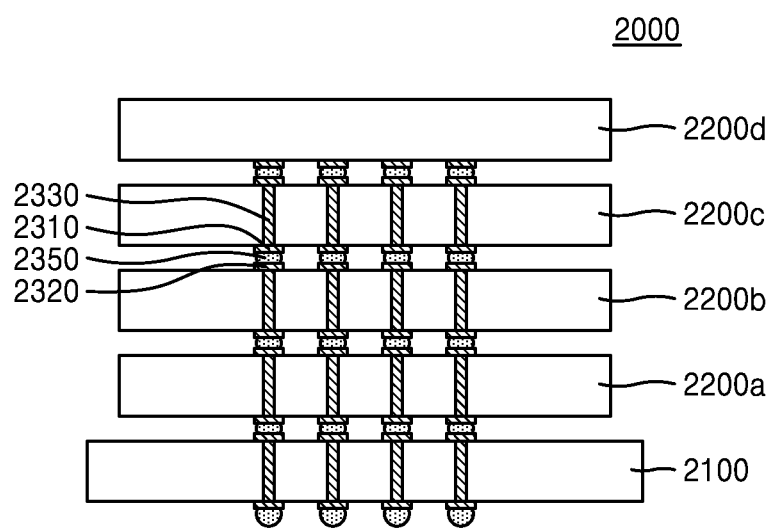
Figure 4:
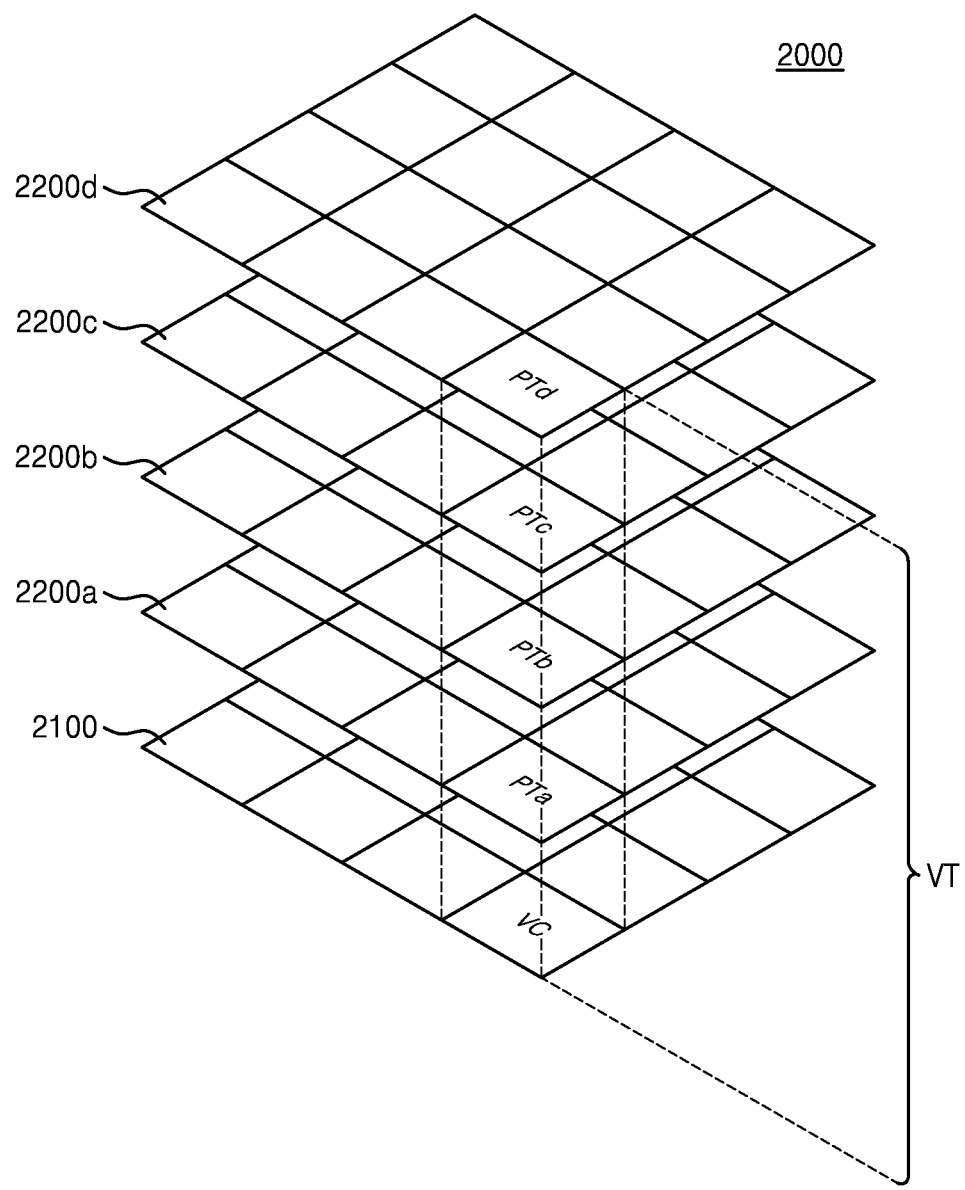

FIG. 3 is a cross-sectional diagram illustrating a semiconductor package 2000 according to embodiments of the inventive concept, and FIG. 4 is a conceptual diagram further illustrating the semiconductor package 2000 of FIG. 3.

Referring to FIGS. 3 and 4, the semiconductor package 2000 may include a logic chip 2100 and memory chips stacked on the logic chip 2100 (e.g., first to fourth memory chips 2200a to 2200d). Here, although the semiconductor package 2000 is shown as including four (4) memory chips, the number of memory chips included in the semiconductor package 2000 may vary by design (e.g., 4, 8, 12, or 16). The logic chip 2100 and the first and fourth memory chips 2200a to 2200d, may be interconnected one with another through chip bumps 2350. For example, the chip bumps 2350 may be disposed between an upper chip pad 2320 of the second memory chip 2200b and a lower chip pad 2310 of the third memory chip 2200c.

At least one of the logic chip 2100 and the first and fourth memory chips 2200a to 2200d may include the semiconductor chip of FIG. 1. For example, the upper chip pad 2320, a through via 2330, and the lower chip pad 2310 of a semiconductor chip of at least one of the logic chip 2100 and the first and fourth memory chips 2200a to 2200d, may respectively correspond to the first lower pad 191, the first through via 141, and the first upper pad 181 of FIG. 1. In addition, another upper chip pad 2320, another through via 2330, and another lower chip pad 2310 of the at least one semiconductor chip may respectively correspond to the second lower pad 192, the second through via 142, and the second upper pad 182 of FIG. 1.

The semiconductor package 2000 may be a hybrid memory cube (HMC) in some embodiments. The first to fourth memory chips 2200a to 2200d may be DRAM chips. Each logic chip 2100 may include vault controllers VC. The first memory chip 2200a may include first partitions PTa, the second memory chip 2200b may include second partitions PTb, the third memory chip 2200c may include third partitions PTc, and the fourth memory chip 2200d may include fourth partitions PTd. The semiconductor package 2000 may variously include one or more vaults VT. Each vault VT may include the vault controller VC of the logic chip 2100, a first partition PTa of the first memory chip 2200a, a second partition PTb of the second memory chip 2200b, a third partition PTc of the third memory chip 2200c, and a fourth partition PTd of the fourth memory chip 2200d. Each vault VT may be functionally and operationally independent. Access to and control of each vault VT may be performed by the vault controller VC.

Figure 5:
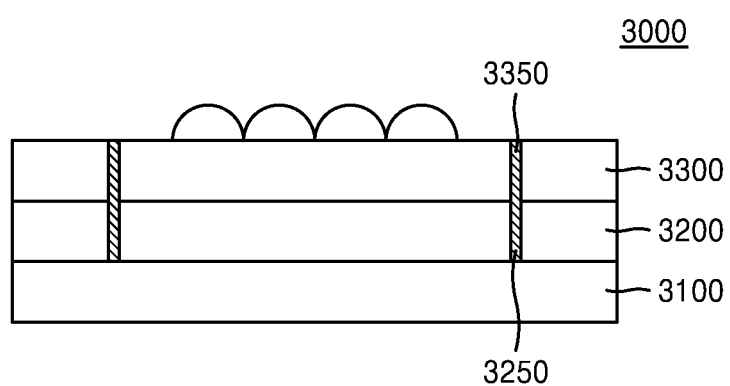

FIG. 5 is a cross-sectional diagram illustrating a semiconductor package 3000 according to embodiments of the inventive concept.

Referring to FIG. 5, the semiconductor package 3000 may include stacked first, second and third semiconductor chips 3100, 3200 and 3300. In some embodiments, the first semiconductor chip 3100 may be a memory chip (e.g., a DRAM chip), the second semiconductor chip 3200 may be a logic chip (e.g., a digital signal processing (DSP) chip), and the third semiconductor chip 3300 may be a CIS chip. In another embodiment, the first semiconductor chip 3100 may be a logic chip (e.g., a DSP chip), the second semiconductor chip 3200 may be a memory chip (e.g., a DRAM chip), and the third semiconductor chip 3300 may be a CIS chip. In still another embodiment, a memory chip and a CIS chip may be integrated into a single chip, and the semiconductor package 3000 may include only the second semiconductor chip 3200 (e.g., a logic chip) and the third semiconductor chip 3300 (e.g., the memory+CIS chip).

At least one of the first, second and third semiconductor chips 3100, 3200 and 3300 of FIG. 5 may include the semiconductor chip 100 of FIG. 1. For example, one through via 3250 passing through the second semiconductor chip 3200 may correspond to the first through via 141 of FIG. 1, and another through via 3250 passing through the second semiconductor chip 3200 may correspond to the second through via 142 of FIG. 1. Additionally or alternately, one through via 3350 passing through the third semiconductor chip 3300 may correspond to the first through via 141 of FIG. 1, and another through via 3350 passing through the third semiconductor chip 3300 may correspond to the second through via 142 of FIG. 1.

Figure 6:
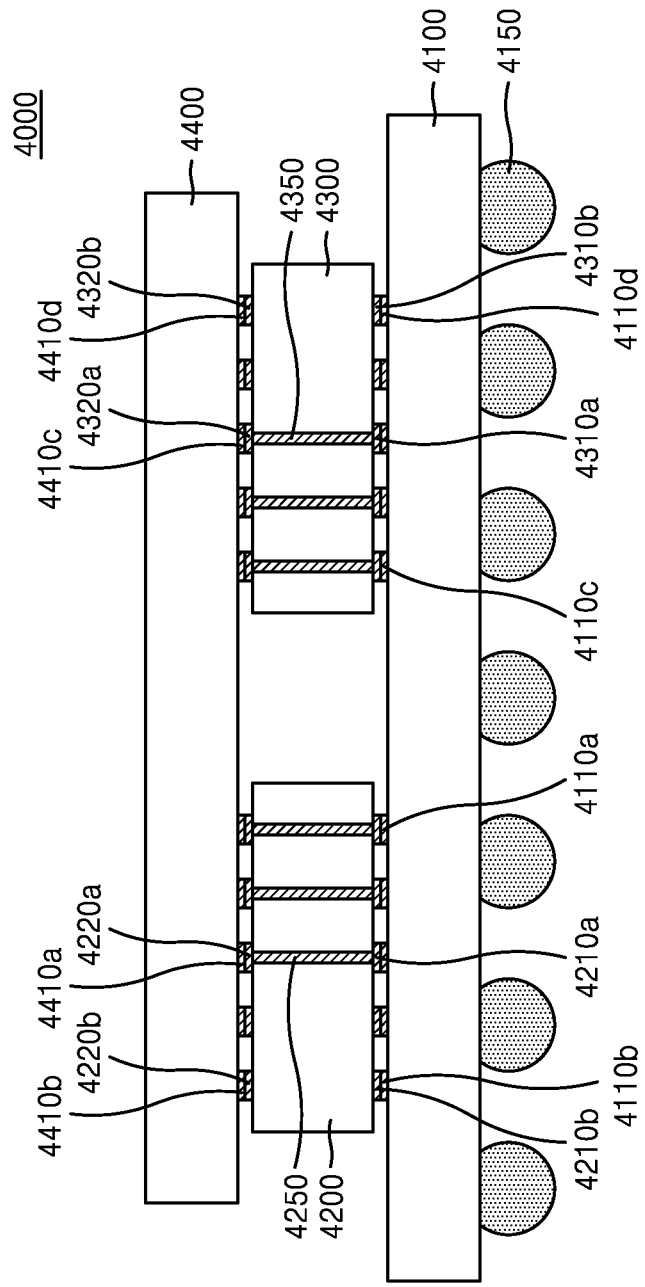

FIG. 6 is a cross-sectional diagram illustrating a semiconductor package 4000 according to embodiments of the inventive concept.

Referring to FIG. 6, the semiconductor package 4000 may include a package substrate 4100, a first semiconductor chip 4200 and a second semiconductor chip 4300 on the package substrate 4100, and a third semiconductor chip 4400 on the first semiconductor chip 4200 and the second semiconductor chip 4300. The semiconductor package 4000 may be connected to the outside of the semiconductor package 4000 through a package bump 4150.

In some embodiments, the first semiconductor chip 4200 may be connected to the package substrate 4100, without bumps, by direct bonding between a first lower pad 4210a of the first semiconductor chip 4200 and a first upper pad 4110a of the package substrate 4100 and by direct bonding between a second lower pad 4210b of the first semiconductor chip 4200 and a second upper pad 4110b of the package substrate 4100. In some embodiments, the second semiconductor chip 4300 may be connected to the package substrate 4100, without bumps, by direct bonding between a first lower pad 4310a of the second semiconductor chip 4300 and a third upper pad 4110c of the package substrate 4100 and by direct bonding between a second lower pad 4310b of the second semiconductor chip 4300 and a fourth upper pad 4110d of the package substrate 4100.

In some embodiments, the third semiconductor chip 4400 may be connected to the first semiconductor chip 4200, without bumps, by direct bonding between a first lower pad 4410a of the third semiconductor chip 4400 and a first upper pad 4220a of the first semiconductor chip 4200 and by direct bonding between a second lower pad 4410b of the third semiconductor chip 4400 and a second upper pad 4220b of the first semiconductor chip 4200. In some embodiments, the third semiconductor chip 4400 may be connected to the first semiconductor chip 4200, without bumps, by direct bonding between a third lower pad 4410c of the third semiconductor chip 4400 and a first upper pad 4320a of the second semiconductor chip 4300 and by direct bonding between a fourth lower pad 4410d of the third semiconductor chip 4400 and a second upper pad 4320b of the second semiconductor chip 4300.

At least one of the first semiconductor chip 4200 and the second semiconductor chip 4300 may include the semiconductor chip 100 of FIG. 1. For example, the first lower pad 4210a, a through via 4250, and the first upper pad 4220a of the first semiconductor chip 4200 may respectively correspond to the first upper pad 181, the first through via 141, and the first lower pad 191 of the semiconductor chip 100 of FIG. 1. In addition, another first lower pad 4210a, another through via 4250, and another first upper pad 4220a of the first semiconductor chip 4200 may respectively correspond to the second upper pad 182, the second through via 142, and the second lower pad 192 of the semiconductor chip 100 of FIG. 1.

Additionally or alternately, the first lower pad 4310a, a through via 4350, and the first upper pad 4320a of the second semiconductor chip 4300 may respectively correspond to the first upper pad 181, the first through via 141, and the first lower pad 191 of the semiconductor chip 100 of FIG. 1. In addition, another first lower pad 4310a, another through via 4350, and another first upper pad 4320a of the second semiconductor chip 4300 may respectively correspond to the second upper pad 182, the second through via 142, and the second lower pad 192 of the semiconductor chip 100 of FIG. 1.

Figure 7:
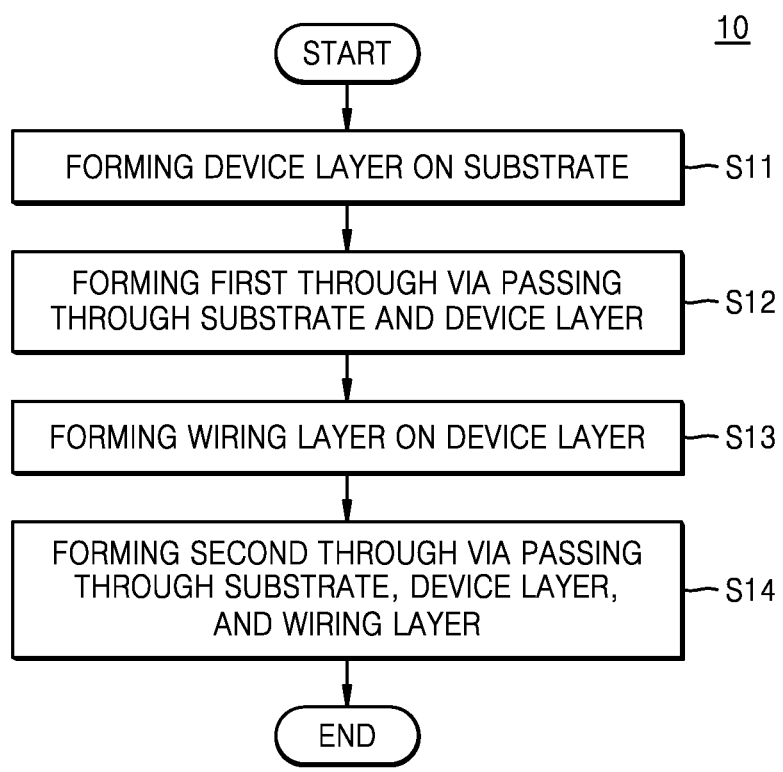
FIG. 7 is a flowchart illustrating in one example a method of manufacturing a semiconductor chip according to embodiments of the inventive concept.

FIG. 7 is a flowchart illustrating in one example a method 10 of manufacturing a semiconductor chip according to embodiments of the inventive concept, and FIGS. 8A to 8G are related cross-sectional diagrams further illustrating the method 10 of FIG. 7.

Figure 8A:
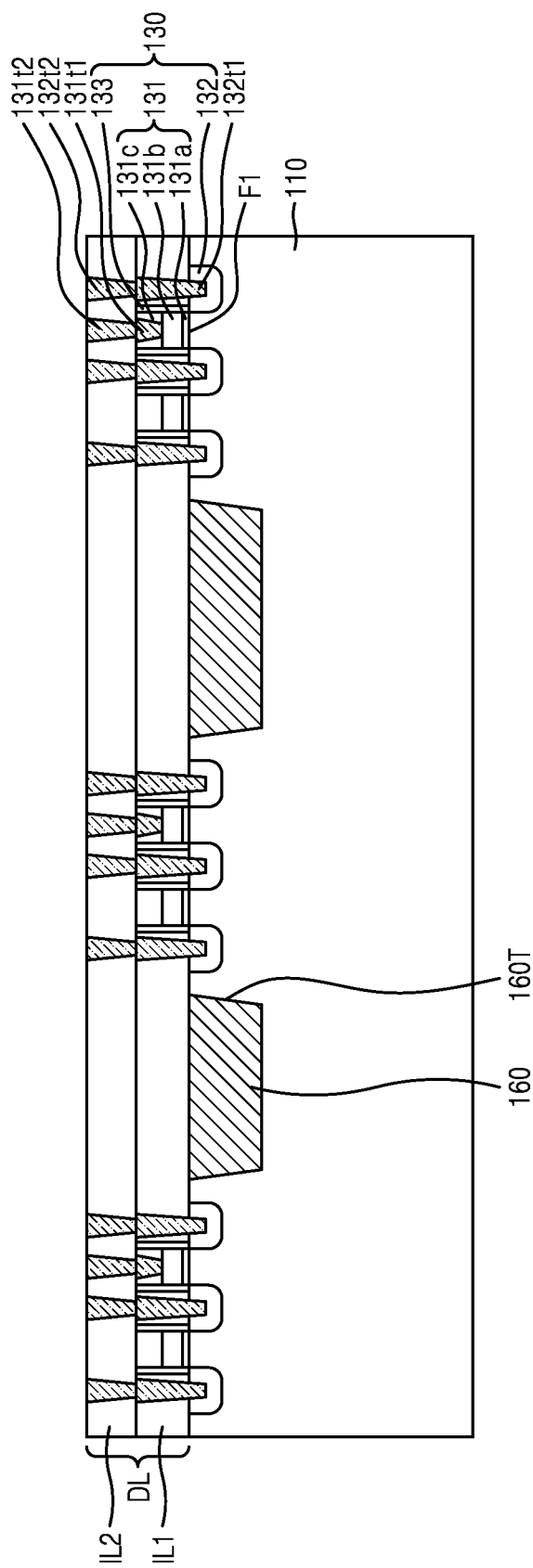
FIGS. 8A, 8B, 8C, 8D, 8E, 8F and 8G (hereafter collectively, "FIGS. 8A to 8G") are related cross-sectional diagrams illustrating in one example a method of manufacturing a semiconductor chip according to embodiments of the inventive concept.

Referring to FIGS. 7 and 8A, a device layer DL is formed on the substrate 110 (step S11). For example, a deep trench 160T is formed in the substrate 110, and the deep trench 160T is filled with the deep trench isolation layer 160. Transistors 130 are formed on the substrate 110, and a first interlayer insulating layer IL1 is formed on the substrate 110 and the transistors 130. A first source/drain contact 132t1 contacting the source/drain 132 and a first gate contact 131t1 contacting the gate electrode 131b are formed. A second interlayer insulating layer IL2 is formed on the first interlayer insulating layer ILL A second source/drain contact 132t2 and a second gate contact 131t2 are formed, wherein the second source/drain contact 132t2 passes through the second interlayer insulating layer IL2 to contact the first source/drain contact 132t1 and the second gate contact 131t2 passes through the second interlayer insulating layer IL2 to contact the first gate contact 131t1.

Figure 8B:
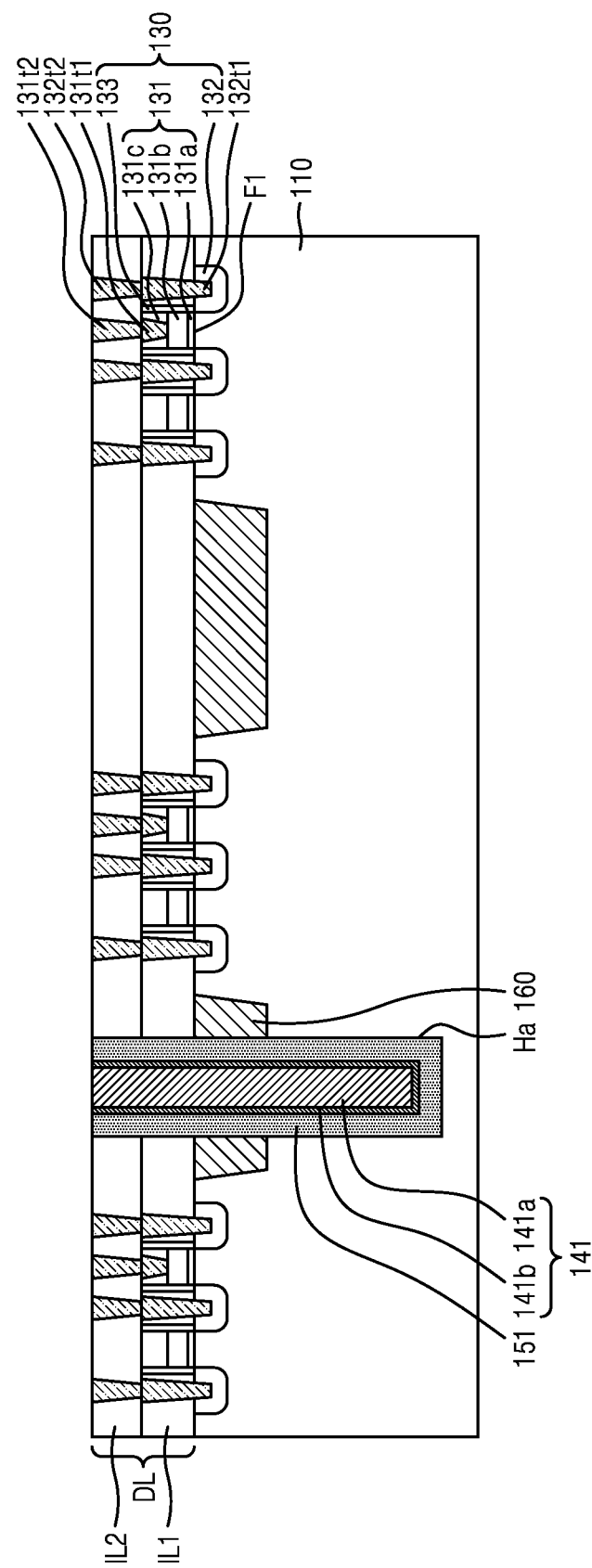

Referring to FIGS. 7 and 8B, a first through via 141 is formed passing through the substrate 110 and the device layer DL (step S12). For example, a first hole Ha is formed through the substrate 110, the device layer DL, and the deep trench isolation layer 160. However, the first hole Ha may not completely pass through the substrate 110. A first through via insulating layer 151, a first through via barrier layer 141b, and a first through via metal layer 141a are formed on a side surface and bottom of the first hole Ha and a top surface of the device layer DL. Next, the first through via insulating layer 151, the first through via barrier layer 141b, and the first through via metal layer 141a may be flattened to expose the top surface of the device layer DL. Through the above process, the first through via 141 may be completely formed.

Figure 8C:
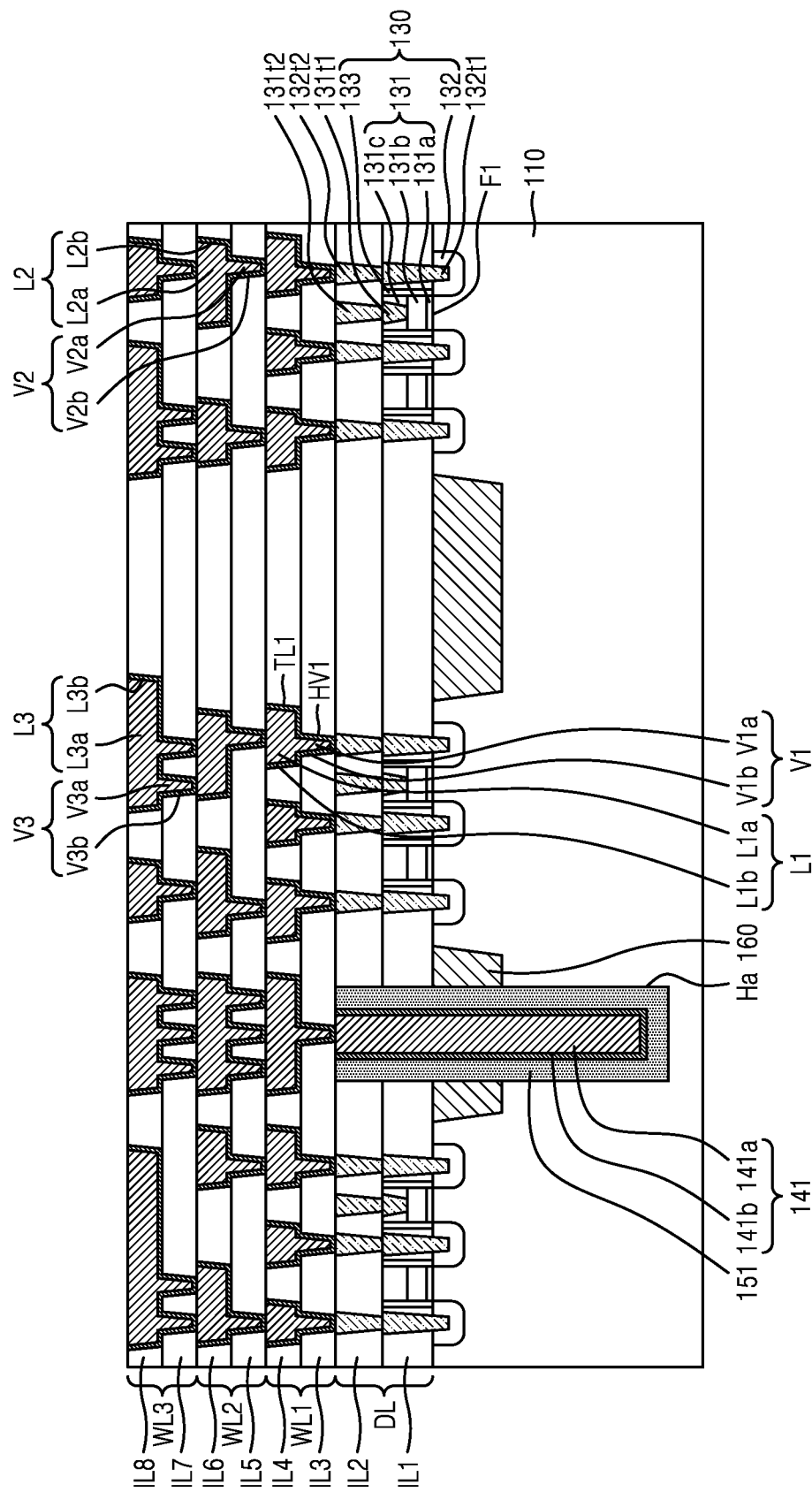

Referring to FIGS. 7 and 8C, at least one wiring layer, for example, first, second and third (or "first to third") wiring layers WL1, WL2 and WL3 (or "WL1 to WL3") may be formed on the device layer DL (step S13). For example, a first wiring layer WL may be formed. That is, a third interlayer insulating layer IL3 and a fourth interlayer insulating layer IL4 may be formed on the device layer DL. A first via hole HV1 is formed in the third interlayer insulating layer IL3, and a first line trench TL1 is formed in the fourth interlayer insulating layer IL4. A barrier layer is formed on the side surface and bottom of the first via hole HV1, the side surface and bottom of the first line trench TL1, and the top surface of the fourth interlayer insulating layer IL4. A metal layer is formed on the barrier layer. The barrier layer and the metal layer may be flattened to expose the top surface of the fourth interlayer insulating layer IL4. Accordingly, a first via V1 and a first line L1 may be formed, and a first wiring layer WL1 including the first via V1 may be completely formed. A second wiring layer WL2 and a third wiring layer WL3 may also be formed using the process(es) described in relation to the first wiring layer WL1.

Figure 8D:
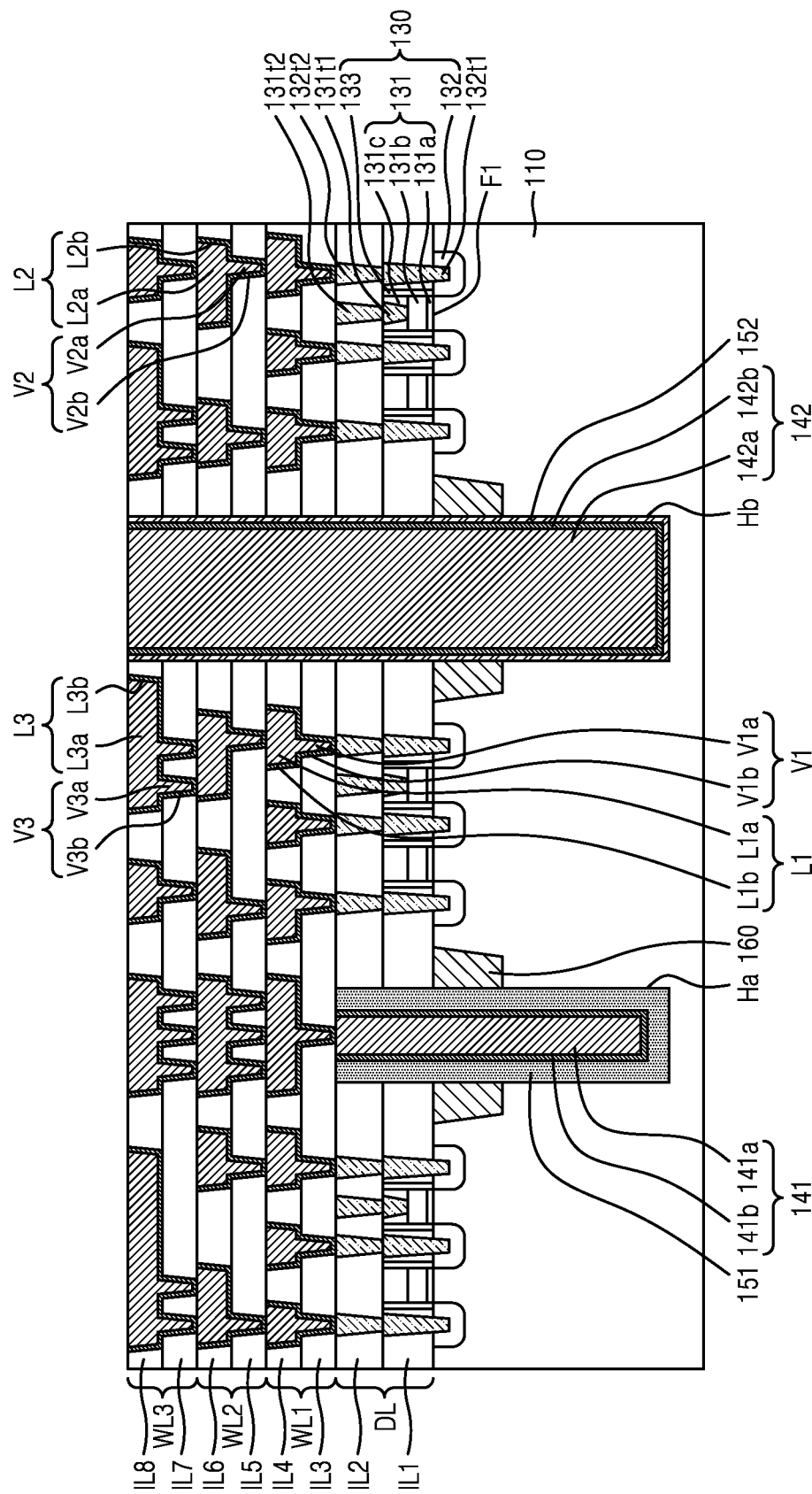

Referring to FIGS. 7 and 8D, a second through via 142 passing through the substrate 110, the device layer DL, and at least one wiring layer (e.g., first to third wiring layers WL1 to WL3) may be formed (step S14). For example, a second hole Hb passing through the substrate 110, the deep trench isolation layer 160, the device layer DL, and the first to third wiring layers WL1 to WL3 may be formed. However, the second hole Hb may not completely pass through the substrate 110. A second through via insulating layer 152, a second through via barrier layer 142b, and a second through via metal layer 142a are formed on the bottom and side surfaces of the second hole Hb and the top surface of the third wiring layer WL3. A second through via 142 may be formed by flattening the second through via insulating layer 152, the second through via barrier layer 142b, and the second through via metal layer 142a so that the top surface of the third wiring layer WL3 is exposed.

Figure 8E:
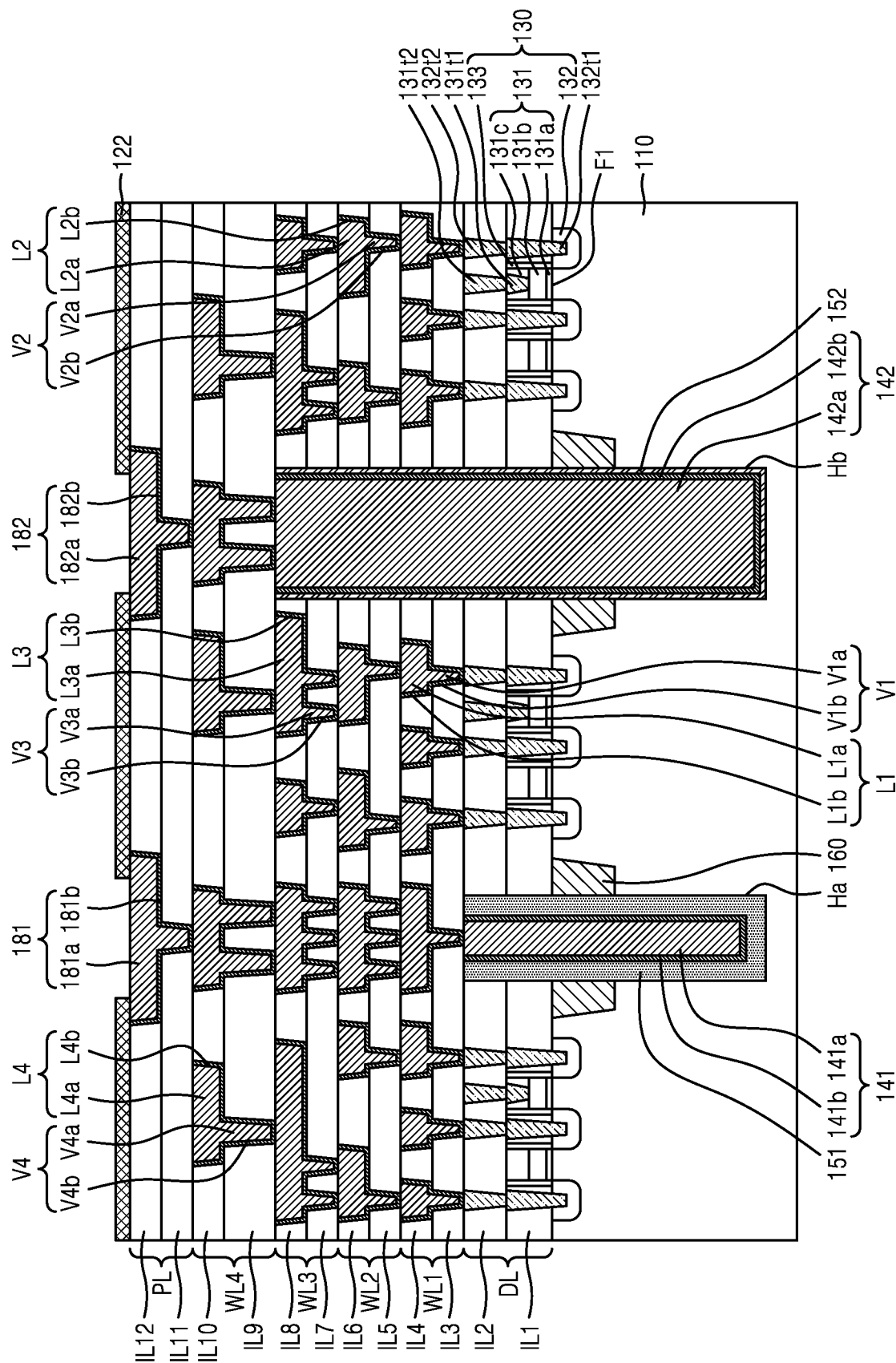

Referring to FIG. 8E, a fourth wiring layer WL4 is formed on the third wiring layer WL3 and the second through via 142. In addition, a pad layer PL is formed on the fourth wiring layer WL4. The fourth wiring layer WL4 may be manufactured in a similar manner to the previously described method of manufacturing the first wiring layer WL1. Next, the pad layer PL is formed. For example, an eleventh interlayer insulating layer IL11 and a twelfth interlayer insulating layer IL12 are formed on the fourth wiring layer WL4. A first upper pad 181 and a second upper pad 182 passing through the eleventh interlayer insulating layer IL11 and the twelfth interlayer insulating layer IL12 may be formed. Next, an upper insulating layer 122 exposing the first upper pad 181 and the second upper pad 182 may be formed on the pad layer PL.

Figure 8F:
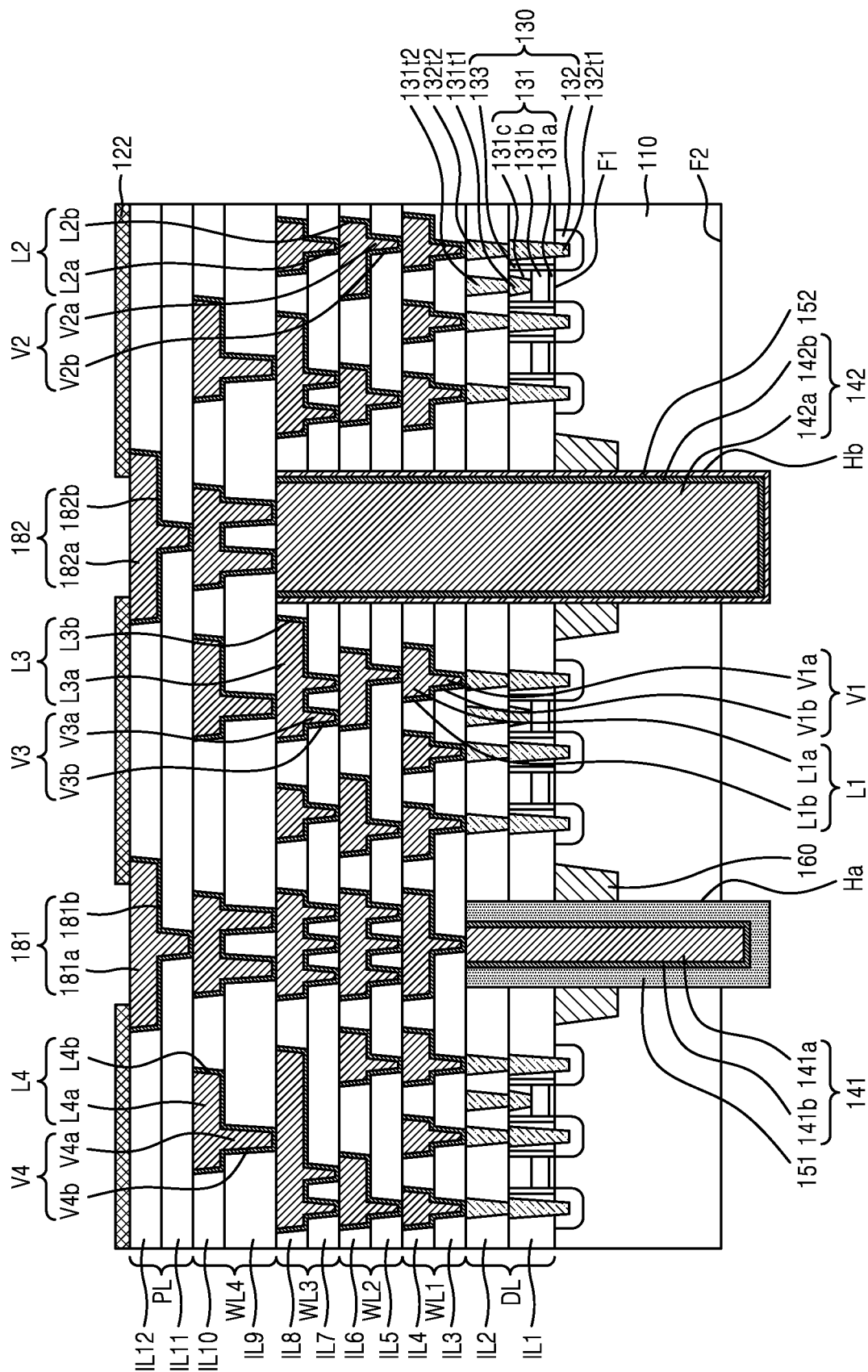

Referring to FIG. 8F, the substrate 110 is etched so that the first through via 141 and the second through via 142 protrude from a second surface F2 of the substrate 110.

Figure 8G:
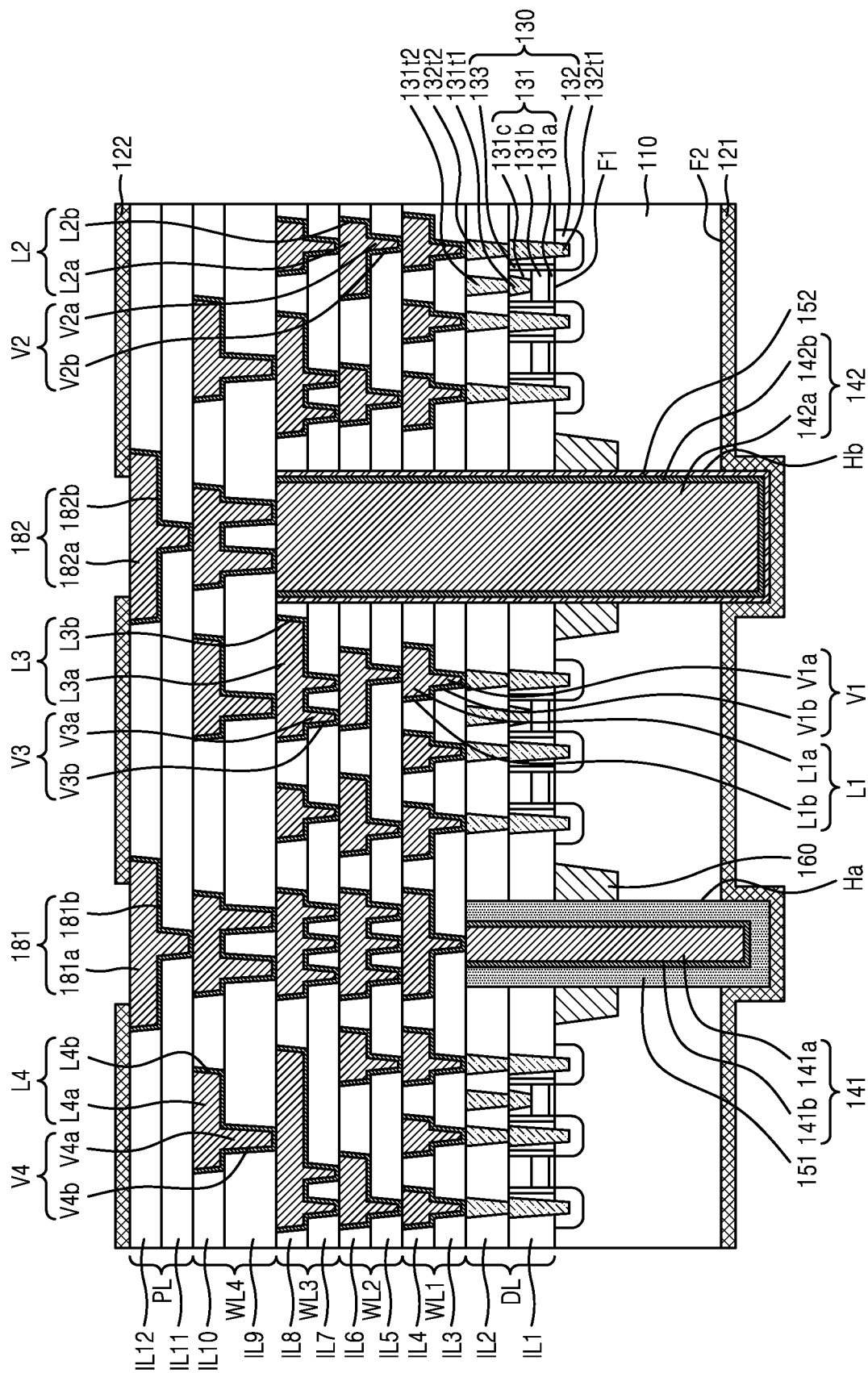

Referring to FIG. 8G, a lower insulating layer 121 is formed on the second surface F2 of the substrate 110, the first through via insulating layer 151, and the second through via insulating layer 152.

Referring back to FIG. 1, parts of the first through via insulating layer 151, the first through via 141, the second through via insulating layer 152, and the second through via 142 protruding from the lower insulating layer 121 may be removed in order to obtain a smooth plane coplanar with the lower insulating layer 121. Next, a first lower pad 191 on the first through via 141 and a second lower pad 192 on the second through via 142 may be formed. Accordingly, the semiconductor chip 100 of FIG. 1 may be manufactured.

While the inventive concept has been particularly shown and described with reference to embodiments thereof, it will be understood that various changes in form and details may be made therein without departing from the scope of the inventive concept as defined by the following claims.

What is claimed is:
1. A semiconductor chip comprising:
a device layer including transistors on a substrate;
a plurality of wiring layers stacked on the device layer, the plurality of wiring layers including a lowermost wiring layer on the device layer, an uppermost wiring layer spaced furthest from the device layer, and at least one intermediate wiring layer between the lowermost and uppermost wiring layers;
a first through via passing through the substrate and the device layer, the first through via having an upper surface contacting a lower surface of the lowermost wiring layer; and a second through via passing through the substrate, the device layer, the lowermost wiring layer, and the at least one intermediate wiring layer, the second through via having an upper surface contacting a lower surface of the uppermost wiring layer, wherein a first height of the first through via is less than a second height of the second through via.

2. The semiconductor chip of claim 1, wherein the first through via communicates a non-power signal.

3. The semiconductor chip of claim 1, wherein the second through via communicates a power signal.

4. The semiconductor chip of claim 1, wherein a first diameter of the first through via is less than a second diameter of the second through via.

5. The semiconductor chip of claim 1, wherein a first volume of the first through via is less than a second volume of the second through via.

6. The semiconductor chip of claim 1, further comprising:
a first through via insulating layer on a side surface of the first through via; and
a second through via insulating layer on a side surface of the second through via,
wherein a first material of the first through via insulating layer is different from a second material of the second through via insulating layer.

7. The semiconductor chip of claim 6, wherein a first dielectric constant of the first material of the first through via insulating layer is less than a second dielectric constant of the second material of the second through via insulating layer.

8. The semiconductor chip of claim 1, further comprising:
a first through via insulating layer on a side surface of the first through via; and
a second through via insulating layer on a side surface of the second through via,
wherein a first thickness of the first through via insulating layer is greater than a second thickness of the second through via insulating layer.

9. A semiconductor chip comprising:
a device layer including transistors on a substrate;
a wiring layer on the device layer;
a first through via passing through the device layer and the substrate;
a second through via passing through the wiring layer, the device layer and the substrate,
a first through via insulating layer on a side surface of the first through via; and
a second through via insulating layer on a side surface of the second through via,
wherein a first material of the first through via insulating layer is different from a second material of the second through via insulating layer, and
wherein a first height of the first through via is less than a second height of the second through via.

10. The semiconductor chip of claim 9, wherein a first dielectric constant of the first material of the first through via insulating layer is less than a second dielectric constant of the second material of the second through via insulating layer.

11. The semiconductor chip of claim 9, wherein the first through via communicates a non-power signal.

12. The semiconductor chip of claim 9, wherein the second through via communicates a power signal.

13. The semiconductor chip of claim 9, wherein a first diameter of the first through via is less than a second diameter of the second through via.

14. The semiconductor chip of claim 9, wherein a first volume of the first through via is less than a second volume of the second through via.

15. A semiconductor chip comprising:
a device layer including transistors on a substrate;
a wiring layer on the device layer;
a first through via passing through the device layer and the substrate;
a second through via passing through the wiring layer, the device layer and the substrate,
a first through via insulating layer on a side surface of the first through via; and
a second through via insulating layer on a side surface of the second through via,
wherein a first height of the first through via is less than a second height of the second through via,
wherein a first thickness of the first through via insulating layer is greater than a second thickness of the second through via insulating layer.

16. The semiconductor chip of claim 15, wherein the first through via communicates a non-power signal.

17. The semiconductor chip of claim 15, wherein the second through via communicates a power signal.

18. The semiconductor chip of claim 15, wherein a first diameter of the first through via is less than a second diameter of the second through via.

19. The semiconductor chip of claim 15, wherein a first volume of the first through via is less than a second volume of the second through via.

20. The semiconductor chip of claim 1, further comprising:
a pad layer stacked on the uppermost wiring layer; and
an insulating layer on an upper surface of the pad layer, the insulating layer having openings exposing conductive pads of the pad layer.

* * * * *